United States Patent
Suzuki et al.

(10) Patent No.: US 8,952,427 B2
(45) Date of Patent: Feb. 10, 2015

(54) RANGE SENSOR AND RANGE IMAGE SENSOR

(75) Inventors: Takashi Suzuki, Hamamatsu (JP); Mitsuhito Mase, Hamamatsu (JP)

(73) Assignee: Hamamatsu Photonics K.K, Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/500,130

(22) PCT Filed: Nov. 18, 2010

(86) PCT No.: PCT/JP2010/070601
§ 371 (c)(1),
(2), (4) Date: Apr. 4, 2012

(87) PCT Pub. No.: WO2011/065286
PCT Pub. Date: Jun. 3, 2011

(65) Prior Publication Data
US 2012/0205723 A1    Aug. 16, 2012

(30) Foreign Application Priority Data
Nov. 24, 2009 (JP) ................. 2009-266562

(51) Int. Cl.
*H01L 27/148* (2006.01)
*G11C 19/00* (2006.01)
(Continued)

(52) U.S. Cl.
CPC ........... *G01S 17/89* (2013.01); *H01L 27/14609* (2013.01); *G01S 7/4863* (2013.01); *H01L 27/14603* (2013.01)
USPC ........... 257/215; 257/222; 257/232; 257/238; 257/246; 257/247; 257/249; 257/250; 438/144

(58) Field of Classification Search
USPC ............................. 257/249; 3/249
See application file for complete search history.

(56) References Cited

U.S. PATENT DOCUMENTS 4,490,036 A * 12/1984 Anagnostopoulos ........ 356/3.07
2007/0040194 A1 * 2/2007 Misawa ....................... 257/291
(Continued)

FOREIGN PATENT DOCUMENTS

JP     2004-294420    10/2004
JP     2007-150008    6/2007
(Continued)

*Primary Examiner* — Steven Loke
*Assistant Examiner* — Juanita B Rhodes
(74) *Attorney, Agent, or Firm* — Drinker Biddle & Reath LLP

(57) ABSTRACT

A range image sensor capable of improving its aperture ratio and yielding a range image with a favorable S/N ratio is provided. A range image sensor RS has an imaging region constituted by a plurality of one-dimensionally arranged units on a semiconductor substrate 1 and yields a range image according to a charge amount issued from the units. One unit comprises a photoresponsive region; two pairs of third semiconductor regions 9a, 9b opposing each other while interposing a photogate electrode PG in the opposing direction of first and second longer sides L1, L2; first and second transfer electrodes TX1, TX2 disposed between the third semiconductor regions 9a, 9b and the photogate electrode PG; fourth semiconductor regions 11a, 11b arranged between the third semiconductor regions 9a, 9b such as to oppose each other while interposing the photogate electrode PG in the opposing direction of the first and second longer sides L1, L2; and third transfer electrodes TX3 disposed between the fourth semiconductor regions 11a, 11b and the photogate electrode PG.

5 Claims, 14 Drawing Sheets

(51) Int. Cl.
*H01L 29/768* (2006.01)
*H01L 21/339* (2006.01)
*G01S 17/89* (2006.01)
*H01L 27/146* (2006.01)
*G01S 7/486* (2006.01)

(56) References Cited

U.S. PATENT DOCUMENTS

2007/0158770 A1* 7/2007 Kawahito .................. 257/431
2008/0079833 A1 4/2008 Ichikawa et al.
2009/0134396 A1* 5/2009 Kawahito et al. ............ 257/72
2009/0224139 A1 9/2009 Buettgen et al.
2009/0284731 A1* 11/2009 Jin et al. .................... 356/4.01

FOREIGN PATENT DOCUMENTS

| JP | 2008-8700 | 1/2008 |
| WO | 2007-026779 | 3/2007 |
| WO | 2007/119626 | 10/2007 |
| WO | 2010/013811 | 2/2010 |
| WO | WO 2011/065280 | 6/2011 |

* cited by examiner

*Fig.4*
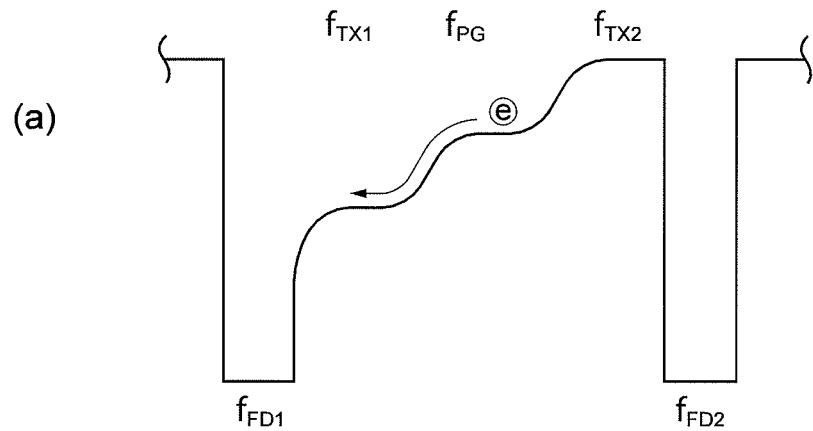
(a)
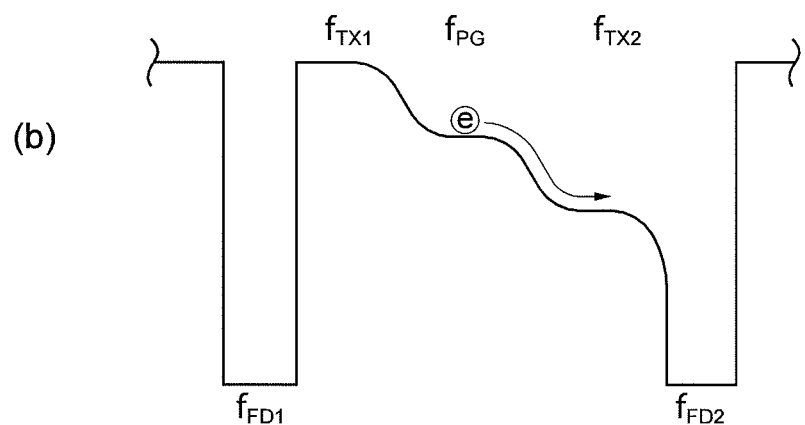
(b)
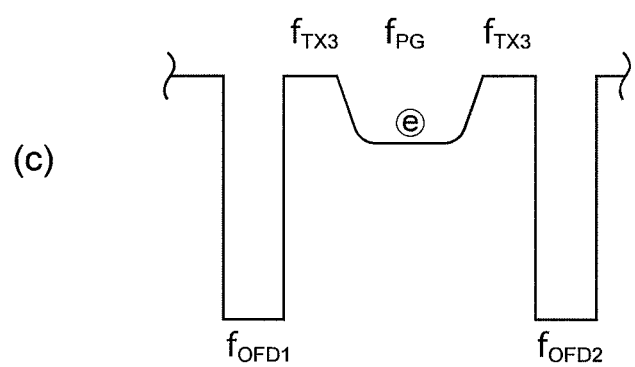
(c)

Fig.5
(a)
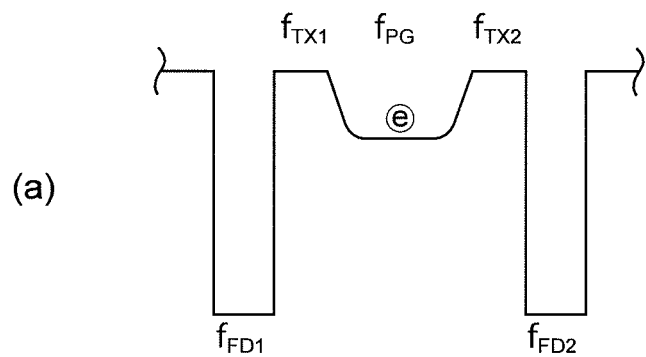
(b)
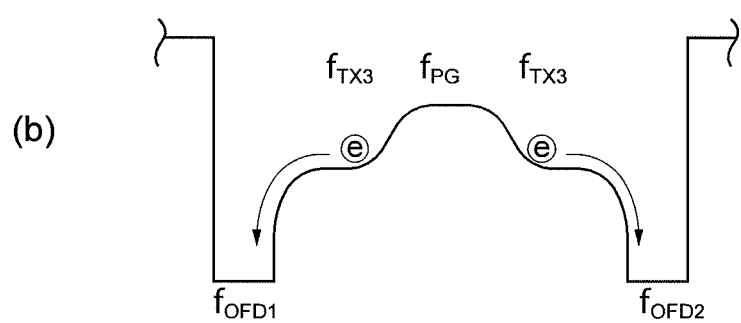

RANGE SENSOR AND RANGE IMAGE SENSOR

TECHNICAL FIELD

The present invention relates to a range sensor and a range image sensor.

BACKGROUND ART

Conventional active optical range sensors have been known to illuminate an object with light from a projecting light source such as an LED (Light Emitting Diode) and detect the light reflected from the object with a photodetector, so as to output a signal corresponding to the distance to the object. While PSD (Position Sensitive Detector) and the like have been known as optical range sensors of optical triangulation type which can simply measure the distance to the object, there have recently been expectations for development of optical range sensors of optical TOF (Time-Of-Flight) type in order to measure the distance more accurately.

Image sensors which can acquire range information and image information at the same time by the same chip have been in demand for automobiles, automated manufacturing systems in factories, and the like. There have been expectations for image sensors which acquire a range image constituted by a single or plurality of range information items separately from the image information. The TOF method is preferably used for such a range sensor.

Known as an example of range image sensors based on the TOF method is a solid-state imaging device disclosed in Patent Literature 1. The range image sensor disclosed in Patent Literature 1 is constituted by two-dimensionally arranged pixels each comprising a rectangular charge generation region; transfer gate electrodes respectively disposed along a set of opposing two sides of the charge generation region; floating drain regions for accumulating signal charges transferred by the transfer gate electrodes; exhausting gate electrodes, respectively disposed along a set of other opposing two sides of the charge generation region, for emitting background charges from the charge generation region; and exhausting drain regions for respectively receiving the background charges emitted by the exhausting gate electrodes. This range image sensor calculates the distance to the object according to the amounts of charges distributed into the floating drain regions. Since the background charges generated in the charge generation region are exhausted, the influence of background light is reduced, whereby the dynamic range improves.

Range image sensors such as those mentioned above have been desired to attain higher sensitivity, i.e., better signal to noise (S/N) ratio. Increasing the areal ratio of the charge generation region (hereinafter referred to as aperture ratio) is one of measures for attaining higher sensitivity.

CITATION LIST

Patent Literature

Patent Literature 1: International Publication No. 2007/026779 pamphlet

SUMMARY OF INVENTION

Technical Problem

Since the transfer gate electrodes and exhausting gate electrodes are arranged such as to surround the charge generation region in the above-mentioned range image sensor disclosed in Patent Literature 1, however, when a light-receiving gate electrode is enlarged in order to improve the aperture ratio, the distance between the centers of the transfer gate electrodes and light-receiving gate electrode or the distance between the centers of the exhausting gate electrodes and light-receiving gate electrode may become so large that high-speed transfer is difficult.

For overcoming the problem mentioned above, it is an object of the present invention to provide a range sensor and range image sensor which can improve the aperture ratio and yield a range image with a favorable S/N ratio.

Solution to Problem

For achieving the above-mentioned object, the range sensor in accordance with the present invention comprises a photoresponsive region, having a two-dimensional form including first and second longer sides opposing each other and first and second shorter sides opposing each other, for generating a charge in response to incident light; at least two pairs of signal charge collection regions, arranged such as to oppose each other while interposing the photoresponsive region in the opposing direction of the first and second longer sides, for collecting signal charges from the photoresponsive region; a plurality of transfer electrodes fed with charge transfer signals having different phases and respectively disposed between the signal charge collection regions and the photoresponsive region; a plurality of unnecessary charge collection regions, arranged between the signal charge collection regions in the opposing direction of the first and second shorter sides such as to oppose each other while interposing the photoresponsive region in the opposing direction of the first and second longer sides, for collecting unnecessary charges from the photoresponsive region; and a plurality of unnecessary charge collection gate electrodes, respectively disposed between the plurality of unnecessary charge collection regions and the photoresponsive region, for selectively blocking and releasing flows of the unnecessary charges from the photoresponsive region to the plurality of unnecessary charge collection regions.

In this range sensor, at least two pairs of signal charge collection regions are arranged such as to oppose each other while interposing the photoresponsive region in the opposing direction of the first and second longer sides, and transfer electrodes are respectively disposed between the signal charge collection regions and the photoresponsive region. The unnecessary charge collection regions are arranged between the signal charge collection regions in the opposing direction of the first and second shorter sides such as to oppose each other while interposing the photoresponsive region in the opposing direction of the first and second longer sides, and the unnecessary charge collection gate electrodes are disposed respectively between the unnecessary charge collection regions and the photoresponsive region. Because of such arrangements, the signal charges and unnecessary charges generated in the photoresponsive region are transferred in the opposing direction of the first and second longer sides by the transfer electrodes and unnecessary charge collection gate electrodes. Therefore, even when the photoresponsive region is formed such as to expand in the opposing direction of the first and second shorter sides, the distance in the opposing direction of the first and second longer sides is held constant, so that a sufficient charge transfer rate can be secured in the transfer electrodes and unnecessary charge collection gate electrodes. Hence, the aperture ratio can be improved while securing the transfer rate. As a result, a range image with a favorable S/N ratio can be obtained.

The plurality of transfer electrodes may have a length in the direction of the first and second longer sides greater than that of the plurality of unnecessary charge collection gate electrodes in the direction of the first and second longer sides. Thus making the length in the first and second longer sides of the transfer electrodes, i.e., the gate width of the transfer electrodes, greater than that of the unnecessary charge collection gate electrodes can improve the transfer rate of signal charges in the transfer electrodes.

The plurality of transfer electrodes may have a plurality of first transfer electrodes fed with charge transfer signals having the same phase and a plurality of second transfer electrodes fed with charge transfer signals having a phase different from that of the charge transfer signals for the first transfer electrodes, the plurality of first transfer electrodes being arranged between the plurality of signal charge collection regions and the photoresponsive region on the side of the first longer side of the photoresponsive region along the first longer side, the plurality of second transfer electrodes being arranged between the plurality of signal charge collection regions and the photoresponsive region on the side of the second longer side of the photoresponsive region opposing the first longer side along the second longer side.

The plurality of transfer electrodes may have a plurality of first transfer electrodes fed with charge transfer signals having the same phase and a plurality of second transfer electrodes fed with charge transfer signals having a phase different from that of the charge transfer signals for the first transfer electrodes, the plurality of first transfer electrodes being arranged between the plurality of signal charge collection regions and the photoresponsive region while interposing the photoresponsive region in the opposing direction of the first and second longer sides, the plurality of second transfer electrodes being arranged between the plurality of signal charge collection regions and the photoresponsive region while interposing the photoresponsive region in the opposing direction of the first and second longer sides.

The plurality of transfer electrodes may have a plurality of first transfer electrodes fed with charge transfer signals having the same phase and a plurality of second transfer electrodes fed with charge transfer signals having a phase different from that of the charge transfer signals for the first transfer electrodes, the plurality of first transfer electrodes and plurality of second transfer electrodes being arranged between the plurality of signal charge collection regions and the photoresponsive region while interposing the photoresponsive region in the opposing direction of the first and second longer sides.

The range image sensor in accordance with the present invention is a range image sensor having an imaging region constituted by a plurality of one- or two-dimensionally arranged units on a semiconductor substrate and yielding a range image according to a charge amount issued from the units, wherein one of the units is the above-mentioned range sensor. By having the above-mentioned range sensor, the range image sensor in accordance with the present invention can improve the aperture ratio and yield a range image with a favorable S/N ratio.

Advantageous Effects of Invention

The present invention can improve the aperture ratio and yield a range image with a favorable S/N ratio.

BRIEF DESCRIPTION OF DRAWINGS

[FIG. 4] is a set of diagrams illustrating potential distributions near a second main face of a semiconductor substrate;

[FIG. 5] is a set of diagrams illustrating potential distributions near the second main face of the semiconductor substrate;

DESCRIPTION OF EMBODIMENTS

In the following, preferred embodiments of the present invention will be explained in detail with reference to the drawings. In the explanations, the same constituents or those having the same functions will be referred to with the same signs while omitting their overlapping descriptions.

Figure 1:
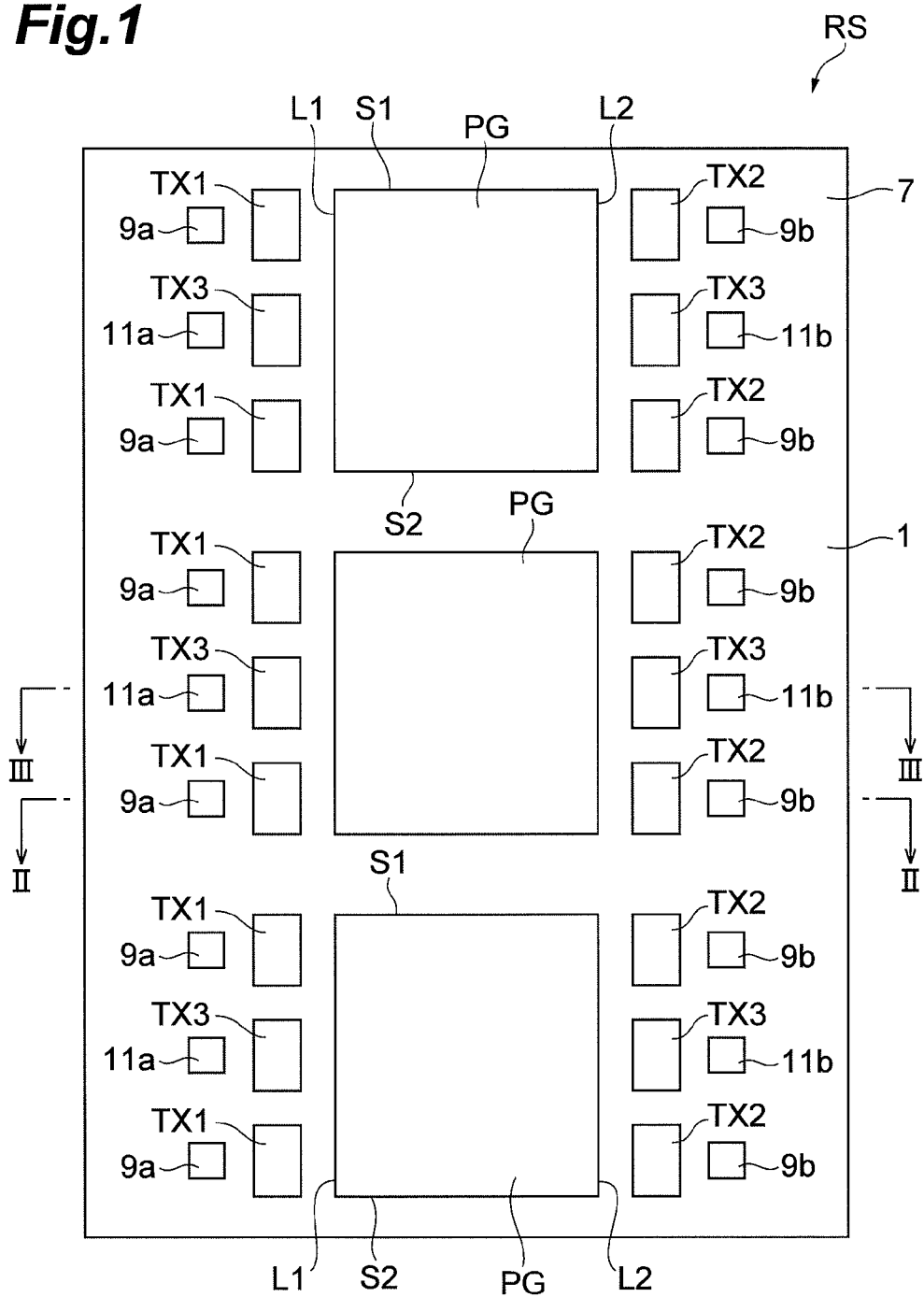
[FIG. 1] is a schematic plan view of an imaging region in the range image sensor in accordance with an embodiment of the present invention.
Figure 2:
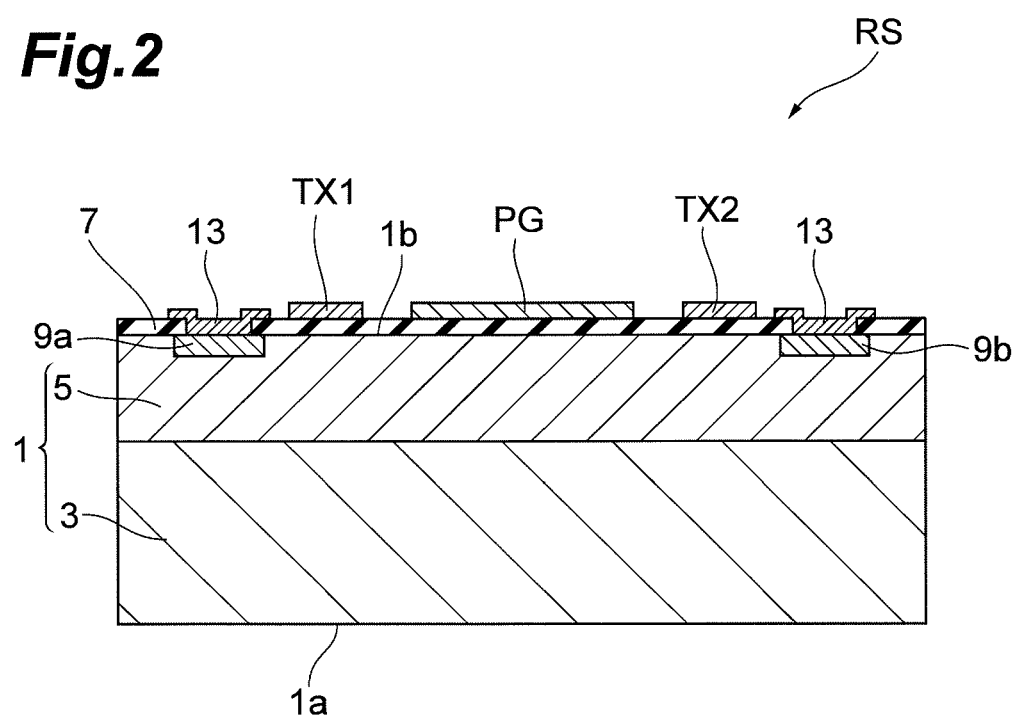
[FIG. 2] is a view illustrating a cross-sectional structure taken along the line of FIG. 1.
Figure 3:
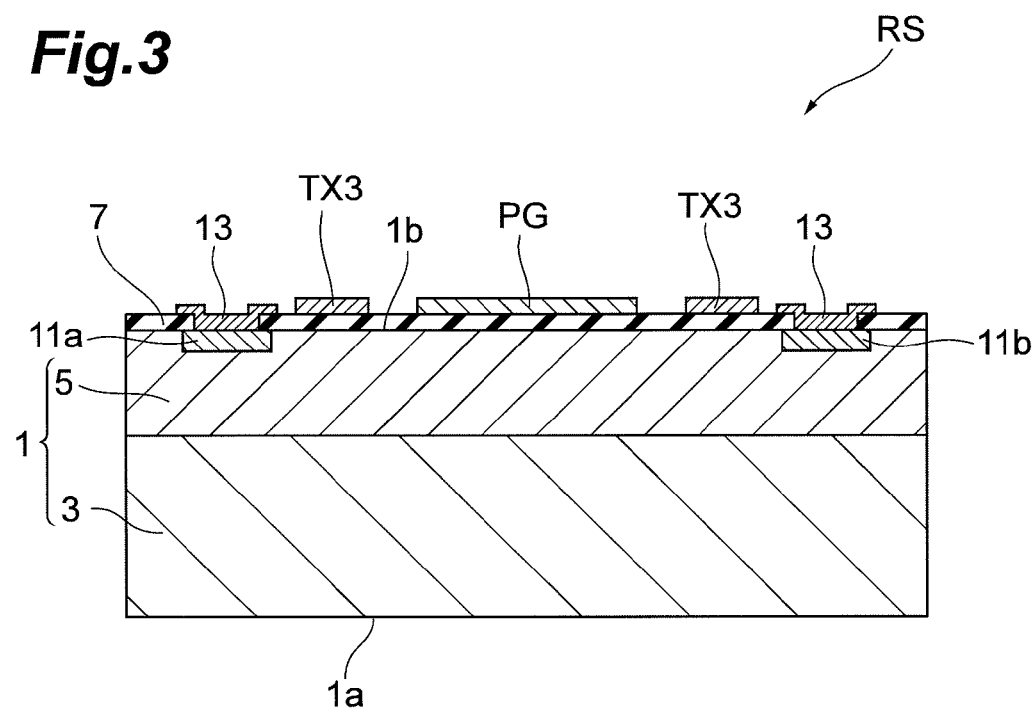
[FIG. 3] is a view illustrating a cross-sectional structure taken along the line of FIG. 1.

FIG. 1 is a schematic plan view of an imaging region of the range image sensor in accordance with an embodiment of the present invention. FIG. 2 is a view illustrating a cross-sectional structure of the imaging region taken along the line II-II, while FIG. 3 is a view illustrating a cross-sectional structure of the imaging region taken along the line III-III.

This range image sensor RS is equipped with a semiconductor substrate 1 having first and second main faces 1$a$, 1$b$ opposing each other. The semiconductor substrate 1 comprises a p-type first semiconductor region 3 located on the first main face 1$a$ side and a p$^-$-type second semiconductor region 5, located on the second main face 1$b$ side, having an impurity content lower than that of the first semiconductor region 3. The semiconductor substrate 1 can be obtained, for example, by growing on a p-type semiconductor substrate a p$^-$-type epitaxial layer having an impurity content lower than that of the semiconductor substrate. An insulating layer 7 is formed on the second main face 1$b$ (second semiconductor region 5) of the semiconductor substrate 1.

A plurality of photogate electrodes PG are one-dimensionally arranged while being spatially separated from each other on the insulating layer 7. Each photogate electrode PG exhibits a rectangular form when seen as a plane. In this embodiment, the photogate electrode PG exhibits an oblong form. That is, the photogate electrode PG has a two-dimensional form including first and second longer sides L1, L2, which are parallel to the aligning direction of the photogate electrodes PG and oppose each other, and first and second shorter sides S1, S2, which are orthogonal to the first and second longer sides L1, L2 and oppose each other. Regions corresponding to the photogate electrodes PG (regions located under the photogate electrodes PG in FIGS. 2 and 3) in the semiconductor substrate 1 (second semiconductor region 5) function as charge generation regions (photoresponsive regions) which generate charges in response to incident light.

In the second semiconductor region 5, n-type third semiconductor regions (signal charge collection regions) 9a, 9b having a higher impurity concentration are formed such as to oppose each other at respective positions separated from the photogate electrodes PG in a direction orthogonal to the aligning direction of the photogate electrodes PG. That is, the third semiconductor regions 9a, 9b are arranged such as to oppose each other while interposing the photogate electrode PG in the opposing direction of the first and second longer sides L1, L2. In this embodiment, two pairs of third semiconductor regions 9a, 9b are formed for each photogate electrode PG. The third semiconductor regions 9a are arranged on the side of the first longer side L1 parallel to the aligning direction of the photogate electrodes PG among the four sides of the photogate electrode PG along the first side L1, while the third semiconductor regions 9b are arranged on the side of the second longer side L2 opposing the first longer side L1 arranged with the third semiconductor regions 9a among the four sides of the photogate electrode PG along the second longer side L2. Each of the third semiconductor regions 9a, 9b exhibits a rectangular form when seen as a plane. In this embodiment, each of the third semiconductor regions 9a, 9b exhibits a square form.

In the second semiconductor region 5, n-type fourth semiconductor regions (unnecessary charge collection regions) 11a, 11b having a higher impurity content are formed at respective positions separated from the photogate electrodes PG in a direction orthogonal to the aligning direction of the photogate electrodes PG. Each fourth semiconductor region 11a is arranged between the third semiconductor regions 9a, 9a on the side of the first longer side L1 parallel to the aligning direction of the photogate electrodes PG among the four sides of the photogate electrode PG, while each fourth semiconductor region 11b is arranged between the third semiconductor regions 9b, 9b on the side of the second longer side L2 opposing the first longer side L1 on the side arranged with the fourth semiconductor region 11a among the four sides of the photogate electrode PG. Each of the fourth semiconductor regions 11a, 11b exhibits a rectangular form when seen as a plane. In this embodiment, each of the fourth semiconductor regions 11a, 11b exhibits a square form.

In this embodiment, "higher impurity content" means an impurity content of about $1\times10^{17}$ cm$^{-3}$ or greater, for example, and is indicated by "+" added to its conduction type. On the other hand, "lower impurity content" means an impurity content of about $10\times10^{15}$ cm$^{-3}$ or lower, for example, and is indicated by "−" added to its conduction type.

The thicknesses and impurity contents of the semiconductor regions are as follows:

First semiconductor region 3: thickness=10 to 1000 μm; impurity content=$1\times10^{12}$ to $10^{19}$ cm$^{-3}$ Second semiconductor region 5: thickness=1 to 50 μm; impurity content=$1\times10^{12}$ to $10^{15}$ cm$^{-3}$ Third semiconductor regions 9a, 9b and fourth semiconductor regions 11a, 11b: thickness=0.1 to 1 μm; impurity content=$1\times10^{18}$ to $10^{20}$ cm$^{-3}$ A reference potential such as a ground potential is fed to the semiconductor substrate 1 (first and second semiconductor regions 3, 5) through a back gate, a through-hole electrode, or the like.

On the insulating layer 7, first and second transfer electrodes TX1, TX2 are arranged for each photogate electrode PG. In this embodiment, 6 each of the first and second transfer electrodes TX1, TX2 are arranged. The first transfer electrodes TX1 are located on the side of the first longer side L1 parallel to the aligning direction of the photogate electrodes PG between the photogate electrodes PG and the third semiconductor regions 9a along the first longer side L1, so as to be separated from the photogate electrodes PG. The second transfer electrodes TX2 are located on the side of the second longer side L2 opposing the first longer side L1 between the photogate electrodes PG and the third semiconductor regions 9b along the second longer side L2, so as to be separated from the photogate electrodes PG. Each of the first and second transfer electrodes TX1, TX2 exhibits a rectangular form when seen as a plane. In this embodiment, each of the first and second transfer electrodes TX1, TX2 exhibits an oblong form whose longer side direction is oriented in the aligning direction of the photogate electrodes PG.

On the insulating layer 7, third transfer electrodes TX3 functioning as unnecessary charge collection gate electrodes are arranged between the first transfer electrodes TX1 and between the second transfer electrodes TX2. In this embodiment, 6 third transfer electrodes TX3 are arranged. Each third transfer electrode TX3 is located between its corresponding photogate electrode PG and fourth semiconductor region 11a, 11b, so as to be separated from the photogate electrode PG. That is, each third transfer electrode TX3 is arranged between the first transfer electrodes TX1 or second transfer electrodes TX2 in the opposing direction of the first and second shorter sides S1, S2. Each third transfer electrode TX3 exhibits a rectangular form when seen as a plane. In this embodiment, each third transfer electrode TX3 exhibits an oblong form whose longer side direction is oriented in the aligning direction of the photogate electrodes PG as with the first and second transfer electrodes TX1, TX2.

In this embodiment, one photogate electrode PG, a region (photoresponsive region) corresponding to the photogate electrode PG in the semiconductor substrate 1, two pairs of third semiconductor regions 9a, 9b, a pair of third transfer electrodes TX3, and a pair of fourth semiconductor regions 11a, 11b constitute one pixel (range sensor) in the range image sensor RS.

The insulating layer 7 is provided with contact holes for exposing the front face of the second semiconductor region 5. Conductors 13 for connecting the third semiconductor regions 9a, 9b and fourth semiconductor regions 11a, 11b to the outside are arranged within the contact holes.

While the semiconductor substrate Si is made of Si, the insulating layer 7 is made of $SiO_2$, and the photogate electrodes PG and transfer electrodes TX1 to TX3 are made of polysilicon, other materials may also be used for them.

The third semiconductor regions 9a, 9b collect signal charges generated in the photoresponsive regions in the semiconductor substrate 1 in response to light incident thereon. The phase of the charge transfer signal applied to the first transfer electrode TX1 shifts by 180° from that of the charge transfer signal applied to the second transfer electrode TX2. The light incident on one pixel is converted into charges within the semiconductor substrate 1 (second semiconductor region 5), and a part of thus generated charges run as signal charges toward the first transfer electrode TX1 or second transfer electrode TX2, i.e., in a direction parallel to the first and second shorter sides S1, S2 of the photogate electrode PG, according to a potential gradient formed by voltages applied to the photogate electrode PG and first and second transfer electrodes TX1, TX2.

When a positive potential is fed to the first or second transfer electrode TX1, TX2, the potential under the first or second transfer electrode TX1, TX2 becomes lower than that of a part of the semiconductor substrate 1 (second semiconductor region 5) located under the photogate electrode PG with respect to electrons, whereby negative charges (electrons) are drawn toward the first or second transfer electrode TX1, TX2, so as to be accumulated in a potential well formed by the third semiconductor region 9a or 9b. An n-type semiconductor includes a positively ionized donor, so as to have a positive potential, thereby attracting electrons. When a potential (ground potential) lower than the above-mentioned positive potential is fed to the first or second transfer electrode TX1, TX2, a potential barrier is caused by the first or second transfer electrode TX1, TX2, so that the charges generated in the semiconductor substrate 1 are not drawn into the third semiconductor region 9a or 9b.

The fourth semiconductor regions 11a, 11b collect unnecessary charges generated in the photoresponsive regions in the semiconductor substrate 1 in response to the light incident thereon. From the light incident on one pixel, a part of charges generated within the semiconductor substrate 1 (second semiconductor region 5) run as unnecessary charges toward the third transfer electrode TX3 according to a potential gradient formed by voltages applied to the photogate electrode PG and the third transfer electrode TX3.

When a positive potential is fed to the third transfer electrode TX3, the potential under the gate provided by the transfer electrode TX3 becomes lower than that of a part of the semiconductor substrate 1 (second semiconductor region 5) located under the photogate electrode PG with respect to electrons, whereby negative charges (electrons) are drawn toward the third transfer electrode TX3, so as to be accumulated in a potential well formed by the fourth semiconductor region 11a, 11b. When a potential (ground potential) lower than the above-mentioned positive potential is fed to the third transfer electrode TX3, a potential barrier is caused by the third transfer electrode TX3, so that the charges generated in the semiconductor substrate 1 are not drawn into the fourth semiconductor region 11a, 11b.

FIG. 4 is a set of diagrams illustrating potential distributions near the second main face 1b of the semiconductor substrate 1 in order to explain an action of accumulating signal charges. FIG. 5 is a set of diagrams illustrating potential distributions near the second main face 1b of the semiconductor substrate 1 in order to explain an action of exhausting unnecessary charges. In FIGS. 4 and 5, the positive direction of potentials is oriented downward. In FIG. 4, (a) and (b) represent potential distributions along the lateral direction of the lateral cross section of FIG. 2, while (c) represents a potential distribution along the lateral direction of the lateral cross section of FIG. 3. In FIG. 5, (a) represents a potential distribution along the lateral direction of the lateral cross section of FIG. 2, while (b) represents a potential distribution along the lateral direction of the lateral cross section of FIG. 3.

FIGS. 4 and 5 illustrate potential $\phi_{TX1}$ of a region directly under the first transfer electrode TX1, potential $\phi_{TX2}$ of a region directly under the second transfer electrode TX2, potential $\phi_{TX3}$ of regions directly under the third transfer electrodes TX3, potential $\phi_{PG}$ of the photoresponsive region directly under the photogate electrode PG, potential $\phi_{FD1}$ of the third semiconductor region 9a, potential $\phi_{FD2}$ of the third semiconductor region 9b, potential $\phi_{OFD1}$ of the fourth semiconductor region 11a, and potential $\phi_{OFD2}$ of the fourth semiconductor region 11b.

The potential $\phi_{PG}$ of the region (photoresponsive region) directly under the photogate electrode PG is set higher than a reference potential which is assumed to equal each of the potentials ($\phi_{TX1}$, $\phi_{TX2}$, $\phi_{TX3}$) in its adjacent regions directly under the first to third transfer electrodes TX1 to TX3 when there is no bias. The potential $\phi_{PG}$ of the photoresponsive region is higher than each of the potentials $\phi_{TX1}$, $\phi_{TX2}$, $\phi_{TX3}$, whereby the potential distribution in these regions is downward concave in the drawing.

The action of accumulating signal charges will be explained with reference to FIG. 4.

When the phase of the charge transfer signal applied to the first transfer electrode TX1 is 0°, the first transfer electrode TX1 is provided with a positive potential, while the second transfer electrode TX2 is provided with a potential having an inverted phase, i.e., a potential (ground potential) having a phase of 180°. In this case, as illustrated in FIG. 4(a), the potential $\phi_{TX1}$ of the semiconductor directly under the first transfer electrode TX1 drops, so that a negative charge e generated in the photoresponsive region flows into the potential well of the third semiconductor region 9a.

On the other hand, the potential $\phi_{TX2}$ of the semiconductor directly under the second transfer electrode TX2 does not drop, so that no charges flow into the potential well of the third semiconductor region 9b. Since the third semiconductor regions 9a, 9b are doped with n-type impurities, their potentials are concave in the positive direction.

When the phase of the charge transfer signal applied to the second transfer electrode TX2 is 0°, the second transfer electrode TX2 is provided with a positive potential, while the first transfer electrode TX1 is provided with a potential having an inverted phase, i.e., a potential (ground potential) having a phase of 180°. In this case, as illustrated in FIG. 4(b), the potential $\phi_{TX2}$ of the semiconductor directly under the second transfer electrode TX2 drops, so that the negative charge e generated in the photoresponsive region flows into the potential well of the third semiconductor region 9b. On the other hand, the potential $\phi_{TX1}$ of the semiconductor directly under the first transfer electrode TX1 does not drop, so that no charges flow into the potential well of the third semiconductor region 9a. As a consequence, signal charges are collected and accumulated into the potential well of the third semiconductor region 9b.

During the time when charge transfer signals whose phase differ from each other by 180° are applied to the first and second transfer electrodes TX1, TX2, respectively, the third transfer electrodes TX3 are provided with the ground potential. Therefore, as illustrated in FIG. 4(c), the potential $\phi_{TX3}$ of the semiconductors directly under the third transfer electrodes TX3 does not drop, so that no charges flow into the potential wells of the fourth semiconductor regions 11.

The foregoing collects and accumulates signal charges into the potential wells of the third semiconductor regions 9a, 9b. The signal charges accumulated in the third semiconductor regions 9a, 9b are read outside.

The action of exhausting unnecessary charges will be explained with reference to FIG. 5.

The first and second transfer electrodes TX1, TX2 are provided with the ground potential. Therefore, as illustrated in FIG. 5(a), the potentials $\phi_{TX1}$, $\phi_{TX2}$ of the semiconductors directly under the first and second transfer electrodes TX1, TX2 do not drop, so that no charges flow into the potential wells of the third semiconductor regions 9a, 9b. On the other hand, the third transfer electrodes TX3 are provided with a positive potential. In this case, as illustrated in FIG. 5(b), the potential $\phi_{TX3}$ of the semiconductors directly under the third transfer electrodes TX3 drops, so that the negative charge e generated in the photoresponsive region flows into the potential wells of the fourth semiconductor regions 11a, 11b. The foregoing collects the unnecessary charges into the potential wells of the fourth semiconductor regions 11a, 11b. The unnecessary charges collected in the potential wells of the fourth semiconductor regions 11a, 11b are let out.

Figure 6:
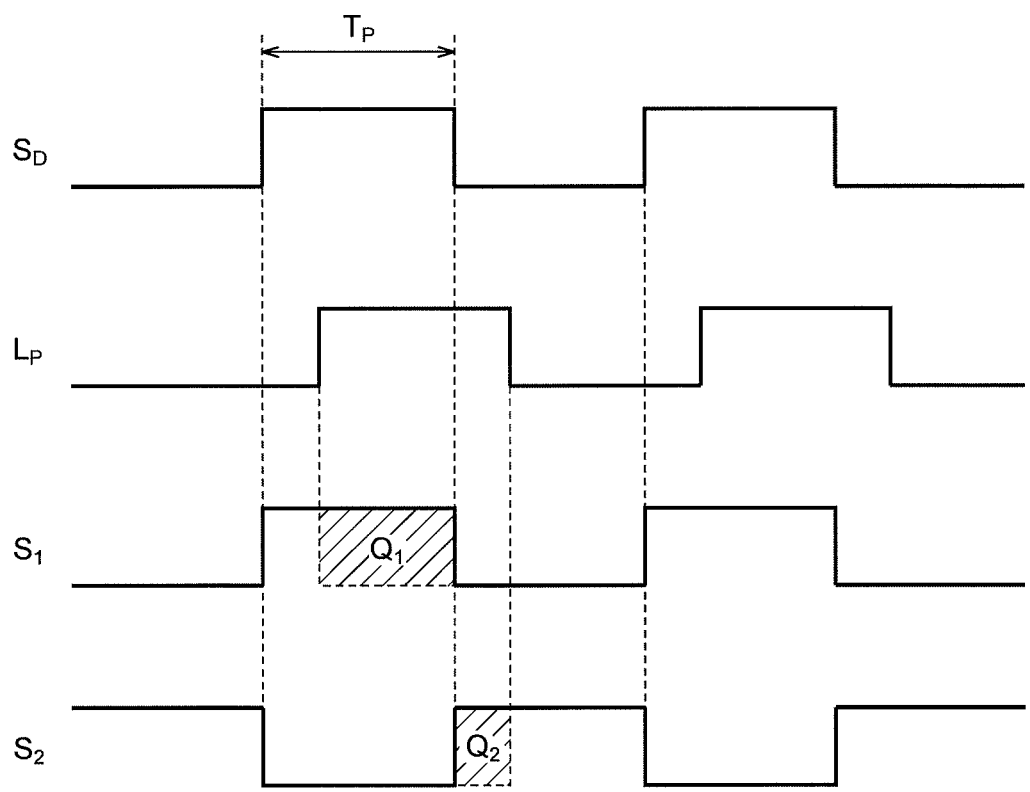
[FIG. 6] is a timing chart of various signals.

FIG. 6 is a timing chart of various signals.

This chart illustrates a driving signal $S_D$ for a light source which will be explained later, an intensity signal $L_P$ of reflected light when returned to the imaging region after impinging on an object from the light source, a charge transfer signal $S_1$ applied to the first transfer electrode TX1, and a charge transfer signal $S_2$ applied to the second transfer electrode TX2. Since the charge transfer signal $S_1$ is in synchronization with the drive signal $S_D$, the phase of the intensity signal $L_P$ of the reflected light with respect to the charge transfer signal $S_1$ is the time of flight of light, which represents the distance from the sensor to the object. The part where the intensity signal $L_P$ of reflected light and the charge transfer signal $S_1$ applied to the first transfer electrode TX1 overlap corresponds to the charge amount $Q_1$ collected in the third semiconductor region 9a, while the part where the intensity signal $L_P$ of reflected light and the charge transfer signal $S_2$ applied to the first transfer electrode TX2 overlap corresponds to the charge amount $Q_2$ collected in the third semiconductor region 9b. When applying each of the charge transfer signals $S_1$, $S_2$, the distance d is calculated by using the ratio of the charge amounts $Q_1$, $Q_2$ collected in the third semiconductor regions 9a, 9b. That is, letting $T_P$ be the width of one pulse of the drive signal, the distance $d=(c/2)\times(T_P\times Q_2/(Q_1+Q_2))$. Here, c is the velocity of light.

Figure 7:
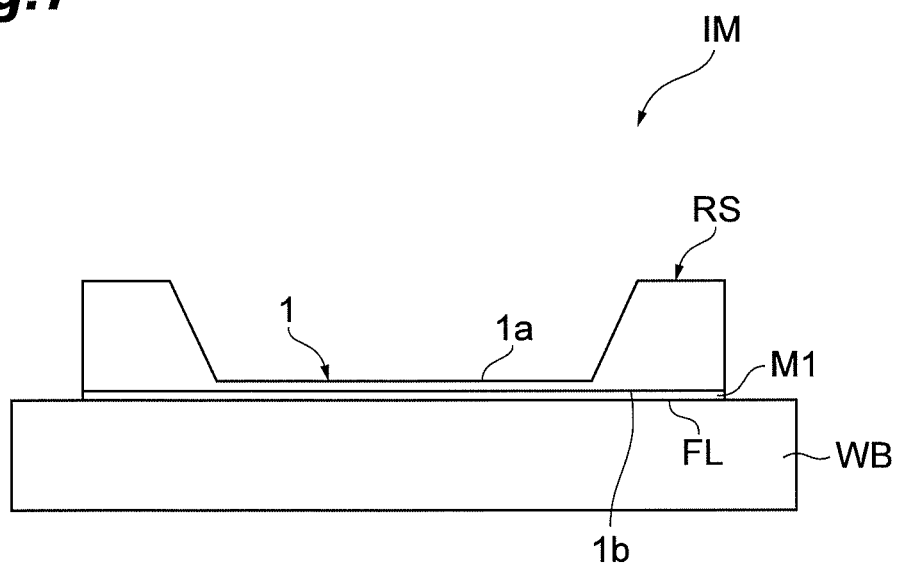
[FIG. 7] is a sectional view of an imaging device as a whole.

FIG. 7 is a sectional view of an imaging device as a whole.

This imaging device IM comprises a range image sensor RS and a wiring board WB. The range image sensor RS is a back-illuminated range image sensor. The range image sensor RS has a center part made thinner than its peripheries, while thus thinned region serves as an imaging region on which light reflected from the object is incident. The range image sensor RS can yield a range output and range image with a high S/N ratio, since no electrodes exist on the light entrance side of its charge generation part.

The range image sensor RS is attached to the wiring board WB through a multilayer wiring board M1 and an adhesive FL such that the second main face 1b side of the semiconductor substrate 1 opposes the wiring board WB. Respective through-hole electrodes (not depicted) electrically connected to the semiconductor regions 9a, 9b, 11a, 11b, transfer electrodes TX1 to TX3, photogate electrodes PG, and the like are disposed within the multilayer wiring board M1. Through bump electrodes (not depicted) interposed between the wiring board WB and the multilayer wiring board M1, the through-hole electrodes of the wiring board WB are connected to their corresponding through-hole electrodes (not depicted) in the wiring board WB, which are exposed at the rear face of the wiring board WB. A light-shielding layer (not depicted) is formed on a surface of an insulating substrate constituting the wiring board WB on the side of an interface with the adhesive FL and inhibits the light transmitted through the range image sensor RS from entering the wiring board WB.

Figure 8:
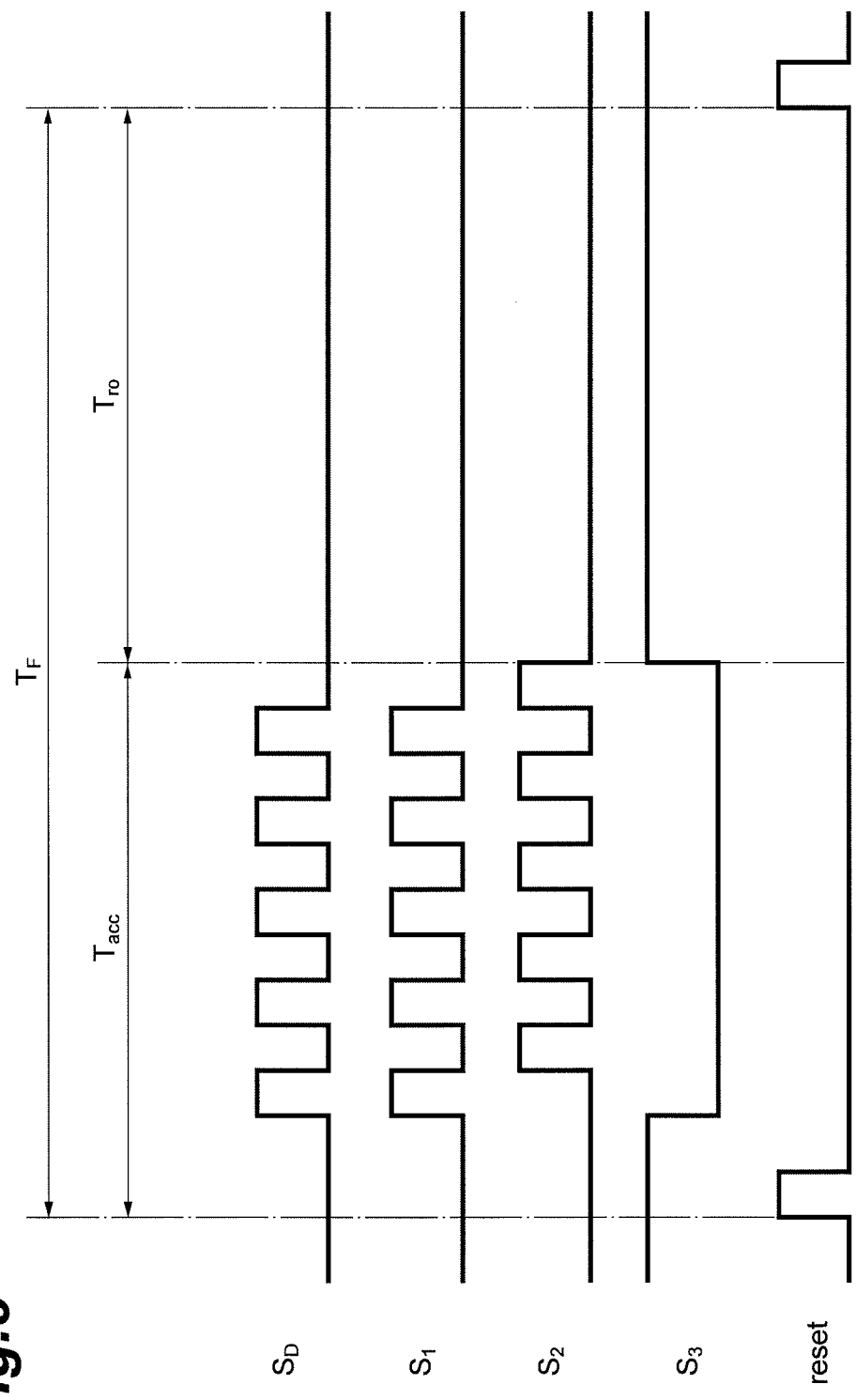
[FIG. 8] is a timing chart of various signals.

FIG. 8 is a timing chart of various signals in practice.

A period $T_F$ of one frame is constituted by a period (accumulation period) $T_{acc}$ for accumulating signal charges and a period (readout period) $T_{ro}$ for reading out the signal charges. When one pixel is taken into consideration, the drive signal $S_D$ having a plurality of pulses is applied to the light source in the accumulation period $T_{acc}$ and, in synchronization therewith, the charge transfer signals S1, S2 having phases opposite to each other are applied to the first and second transfer electrodes TX1, TX2, respectively. Before range measurement, a reset signal reset is applied to the third semiconductor regions 9a, 9b, so that the charges accumulated therein are let out. In this example, the reset signal reset is turned ON for an instant and subsequently OFF, then a plurality of drive vibration pulses are applied in sequence, and the charges are transferred sequentially in synchronization therewith, whereby the signal charges are integrated and accumulated into the third semiconductor regions 9a, 9b.

Thereafter, in the readout period $T_{ro}$, the signal charges accumulated in the third semiconductor regions 9a, 9b are read out. At this time, the charge transfer signal $S_3$ applied to the third transfer electrodes TX3 is turned ON, so as to provide the third transfer electrodes TX3 with a positive potential, whereby the unnecessary charges are collected into the potential wells of the fourth semiconductor regions 11a, 11b.

Figure 9:
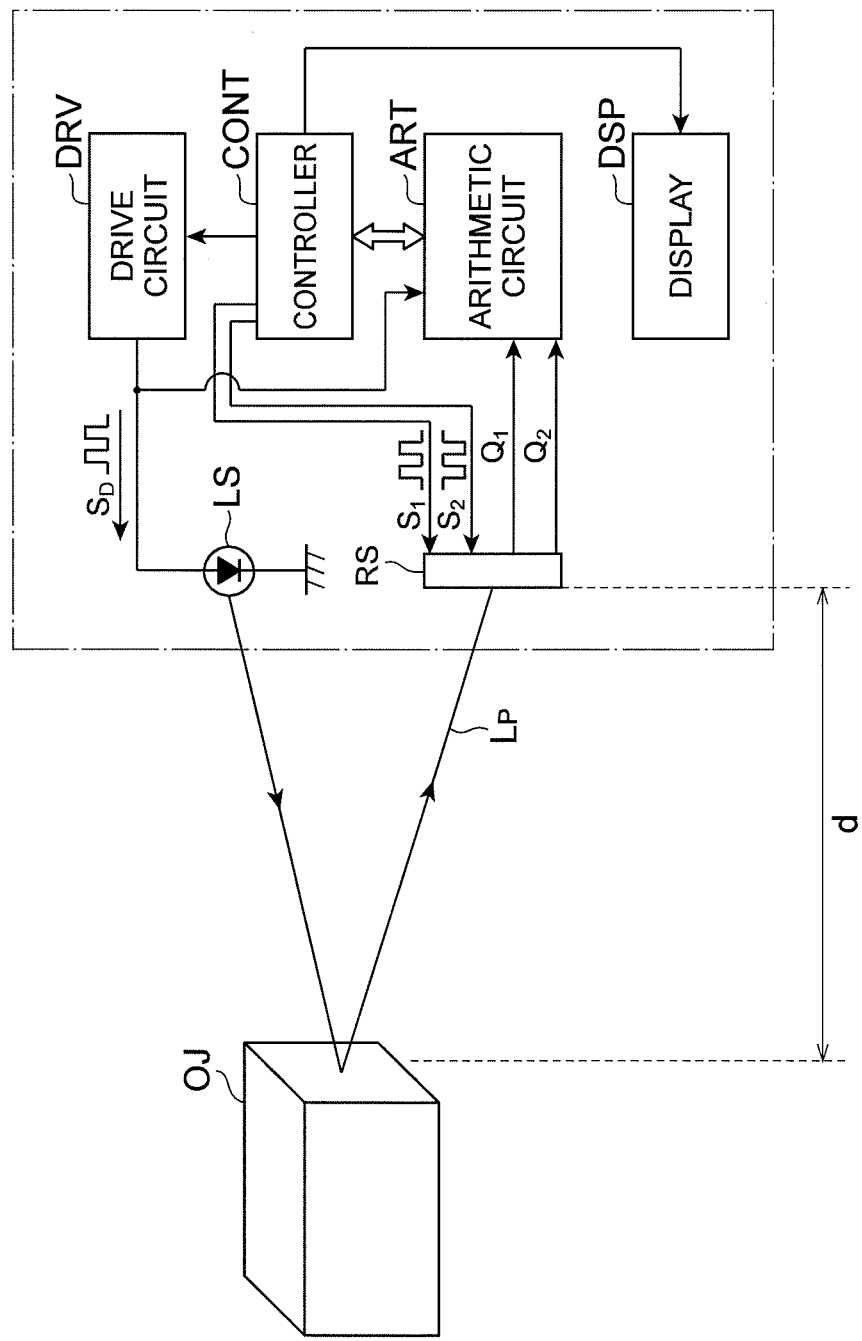
[FIG. 9] is a diagram illustrating an overall structure of a range image measuring apparatus.

FIG. 9 is a diagram illustrating an overall structure of a range image measuring apparatus.

The distance d to an object OJ is measured by the range image measuring apparatus. As mentioned above, the drive signal $S_D$ is applied to a light source LS such as an LED, and the intensity signal $L_P$ of a reflected light image reflected by the object OJ is made incident on the photoresponsive region of the range image sensor RS. The range image sensor RS outputs, for each pixel, the charge amounts $Q_1$, $Q_2$ collected in synchronization with the charge transfer signals $S_1$, $S_2$, and the charge amounts $Q_1$, $Q_2$ are fed into an arithmetic circuit ART in synchronization with the drive signal $S_D$. The arithmetic circuit ART calculates the distance d for each pixel as mentioned above and transfers the result of calculation to a controller CONT. The controller CONT controls a drive circuit DRV for driving the light source LS, outputs the charge transfer signals $S_1$, $S_2$, $S_3$, and causes a display DSP to show the result of calculation fed from the arithmetic circuit ART.

In the range image sensor RS, as explained in the foregoing, two pairs of third semiconductor regions 9a, 9b are arranged such as to oppose each other while interposing the photogate electrode PG in the opposing direction of the first and second longer sides L1, L2, and the first and second transfer electrodes TX1, TX2 are disposed between their corresponding third semiconductor regions 9a, 9b and the photogate electrode PG. The fourth semiconductor regions 11a, 11b are arranged between the third semiconductor regions 9a, 9b in the opposing direction of the first and second shorter sides S1, S2 such as to oppose each other while interposing the photogate electrode PG in the opposing direction of the first and second longer sides L1, L2, and the third transfer electrodes TX3 are disposed between the fourth semiconductor regions 11a, 11b and the photogate electrode PG.

Because of such arrangements, the signal charges and unnecessary charges generated in the photoresponsive region are transferred in the opposing direction of the first and second longer sides L1, L2 by the first to third transfer electrodes TX1 to TX3. Therefore, even when the photoresponsive region (photogate electrode PG) is formed such as to expand in the opposing direction of the first and second shorter sides S1, S2, the distance in the opposing direction of the first and second longer sides L1, L2 is held constant, so that a sufficient charge transfer rate can be secured in the transfer electrodes TX1 to TX3. Hence, the aperture ratio can be improved while securing the transfer rate. As a result, a range image with a favorable S/N ratio can be obtained.

The present invention is not limited to the above-mentioned embodiment. For example, while the above-mentioned embodiment arranges the first transfer electrodes TX1 on the side of the first longer side L1 along the first longer side L1 and the second transfer electrodes TX2 on the side of the second longer side L2 opposing the first longer side L1 along the second side L2, the first and second transfer electrodes TX1, TX2 may be arranged as illustrated in FIG. 10.

Figure 10:
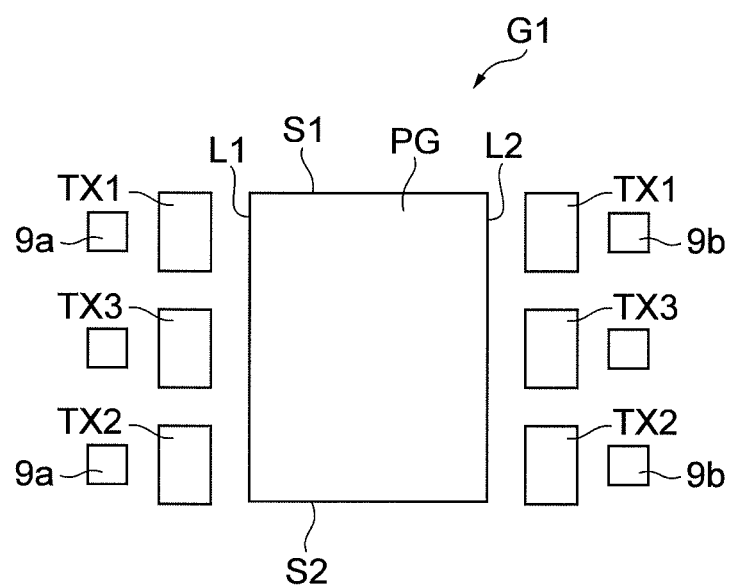
[FIG. 10] is a schematic plan view illustrating a pixel constituting an imaging region of the range image sensor in accordance with a modified example.

FIG. 10 is a schematic plan view illustrating a pixel constituting an imaging region of the range image sensor in accordance with a modified example. In this pixel (range sensor) G1, as illustrated in the drawing, the first transfer electrodes TX1 are disposed between the third semiconductor regions 9a, 9b and the photogate electrode PG such as to oppose each other while interposing the photogate electrode PG, and the second transfer electrodes TX2 are disposed between the third semiconductor regions 9a, 9b and the photogate electrode PG such as to oppose each other while interposing the photogate electrode PG. A range image sensor equipped with thus constructed pixel G1 can also yield operations and effects similar to those of the above-mentioned range image sensor RS.

Figure 11:
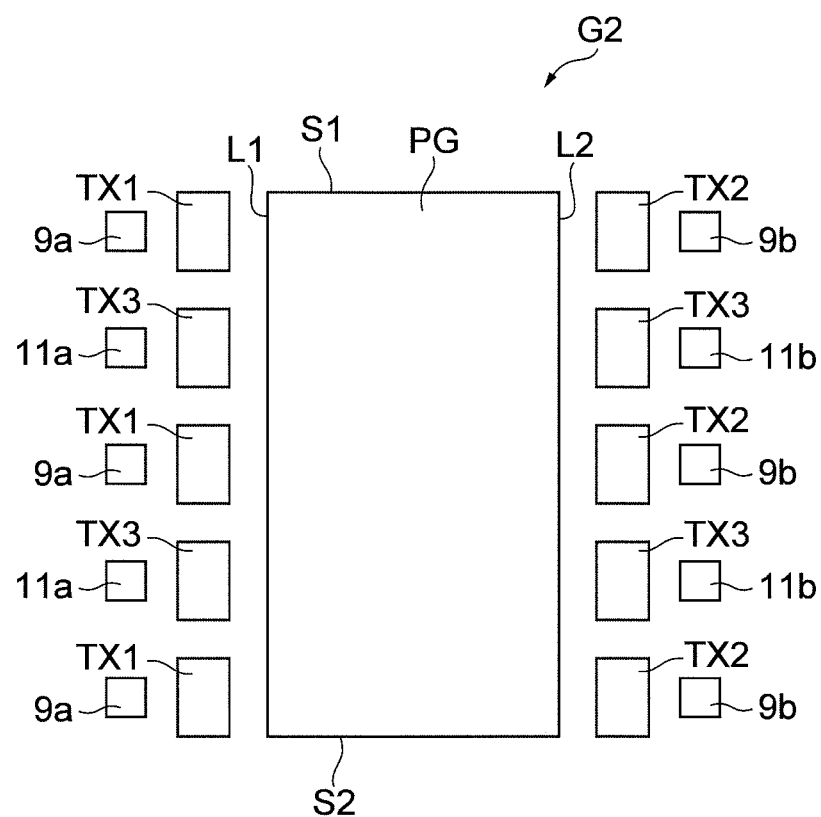
[FIG. 11] is a schematic plan view illustrating a pixel constituting an imaging region of the range image sensor in accordance with a modified example.

While one photogate electrode PG, the photoresponsive region corresponding to the photogate electrode PG in the semiconductor substrate 1, two pairs of first and second transmission electrodes TX1, TX2, two pairs of third semiconductor regions 9a, 9b, one pair of third transfer electrodes TX3, and one pair of fourth semiconductor regions 11a, 11b constitute one pixel in the range image sensor RS in the above-mentioned embodiment, the pixel may be constructed as illustrated in FIG. 11.

FIG. 11 is a schematic plan view illustrating a pixel constituting an imaging region of the range image sensor in accordance with a modified example. As illustrated in the drawing, this pixel G2 is constituted by one photogate electrode PG, the photoresponsive region corresponding to the photogate electrode PG, three pairs of first and second transfer electrodes TX1, TX2, three pairs of third semiconductor regions 9a, 9b, two pairs of third transfer electrodes TX3, and two pairs of fourth semiconductor regions 11a, 11b. The first transfer electrodes TX1 are arranged between the third semiconductor regions 9a and the photogate electrode PG on the side of the first longer side L1 along the first longer side L1, while the second transfer electrodes TX2 are arranged between the third semiconductor regions 9b and the photogate electrode PG on the side of the second longer side L2 along the second longer side L2. The third transfer electrodes TX3 alternate with the first transfer electrodes TX1 and the second transfer electrodes TX2. A range image sensor equipped with thus constructed pixel G2 can also yield operations and effects similar to those of the above-mentioned range image sensor RS.

Figure 12:
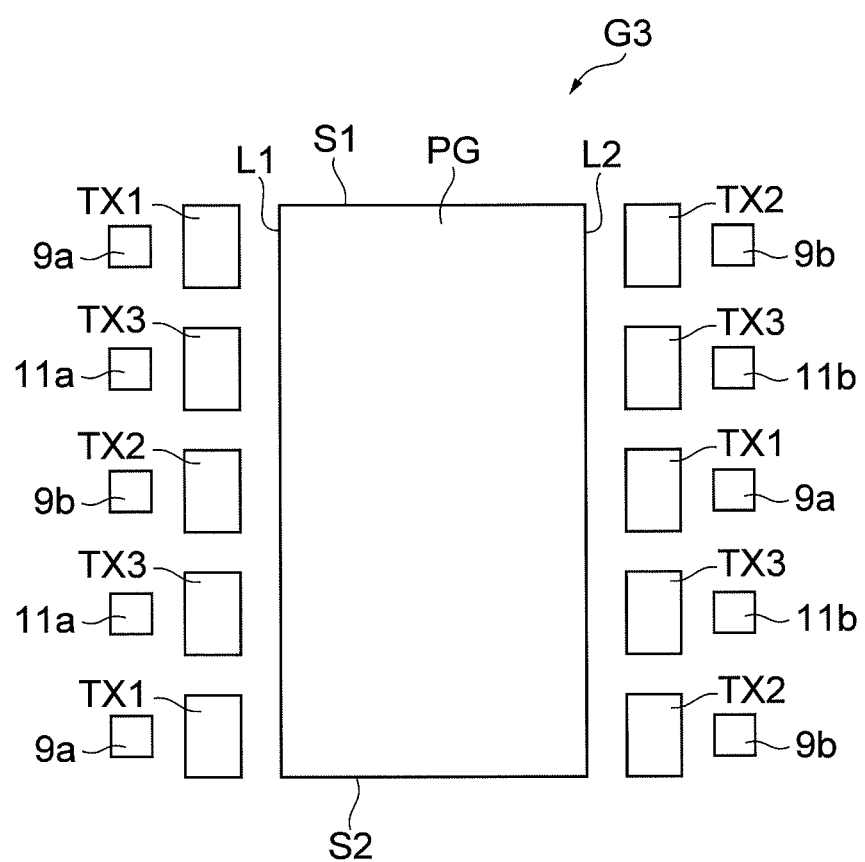
[FIG. 12] is a schematic plan view illustrating a pixel constituting an imaging region of the range image sensor in accordance with a modified example.

In the structure of FIG. 11, the first and second transfer electrodes TX1, TX2 may be arranged as illustrated in FIG. 12. In this pixel G3, as illustrated in FIG. 12, the first, second, and first transfer electrodes TX1, TX2, TX1 are arranged in this order on the side of the first longer side L1 along the first longer side L1. Third transfer electrodes TX3 alternate with the first and second transfer electrodes TX1, TX2. In the pixel G3, the second, first, and second transfer electrodes TX2, TX1, TX2 are arranged in this order on the side of the second longer side L2 along the second longer side L2. Third transfer electrodes TX3 alternate with the first and second transfer electrodes TX1, TX2. A range image sensor equipped with thus constructed pixel G3 can also yield operations and effects similar to those of the above-mentioned range image sensor RS.

Figure 13:
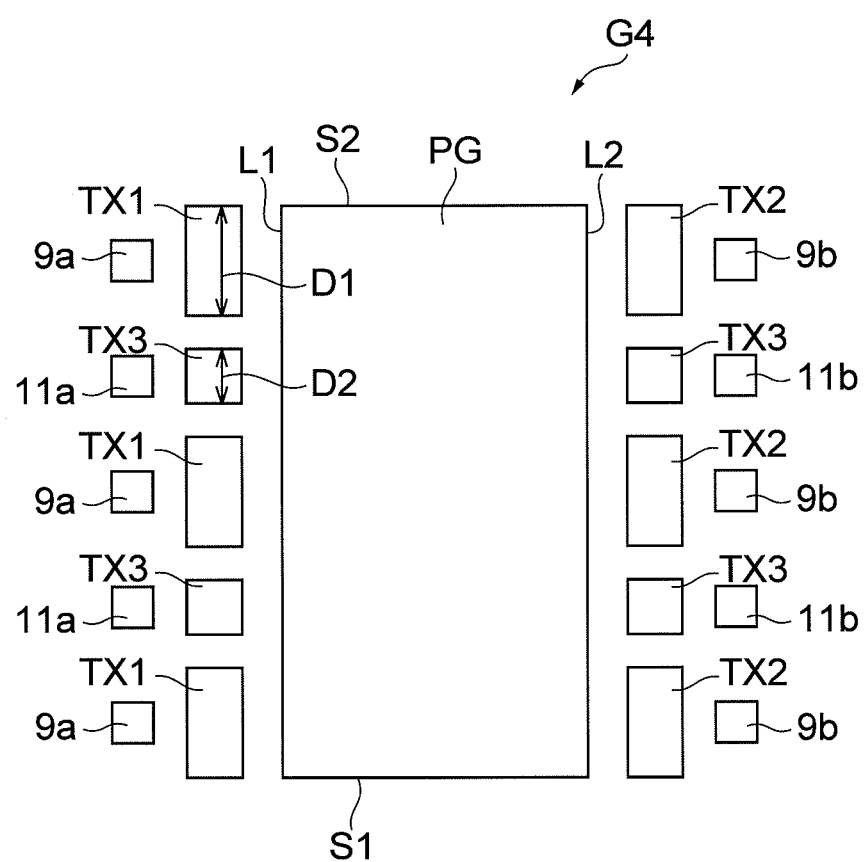
[FIG. 13] is a schematic plan view illustrating a pixel constituting an imaging region of the range image sensor in accordance with a modified example.

While all of the first to third transfer electrodes TX1 to TX3 have equal lengths in the directions of the first and second longer sides L1, L2 (the first to third transfer electrodes TX1 to TX3 have the same form), they may be constructed as illustrated in FIG. 13, for example.

FIG. 13 is a schematic plan view illustrating a pixel constituting an imaging region of the range image sensor in accordance with a modified example. In this pixel G4, as illustrated in the drawing, the length in the direction of the first and second longer sides L1, L2 of the first and second transfer electrodes TX1, TX2, i.e., gate width D1, is greater than the gate width D2 in the direction of the first and second longer sides L1, L2 of the third transfer electrode TX3. This can improve the transfer rate of signal charges in the first and second transfer electrodes TX1, TX2.

Figure 14:
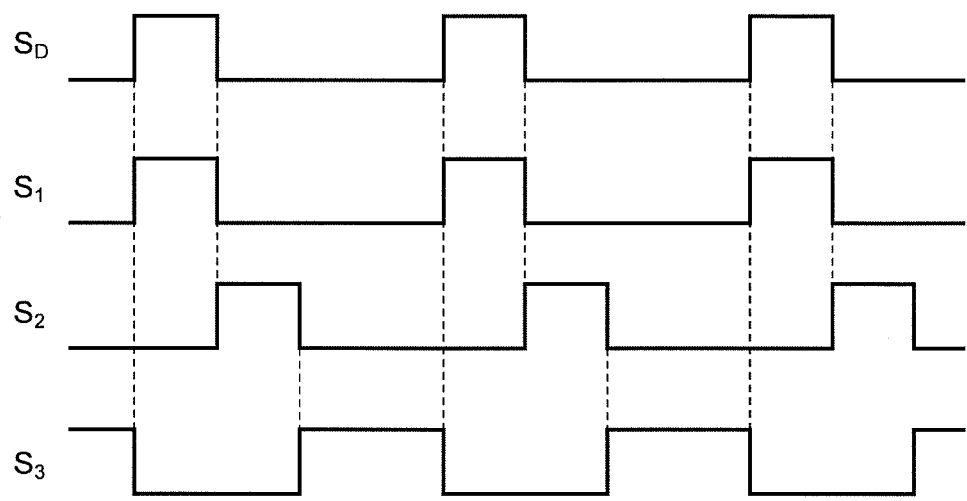
[FIG. 14] is a timing chart of various signals in accordance with a modified example.

FIG. 14 is a timing chart of various signals in accordance with a modified example.

In this modified example, a duty cycle (ON time per unit time) greater than that in the above-mentioned embodiment is set for the drive signal $S_D$. This increases the power for driving the light source LS (see FIG. 9), thereby further improving the S/N ratio. This modified example generates one pulse each of the first to third transfer electrodes TX1 to TX3 for each pulse of the drive signal $S_D$ and thus can improve the range detection accuracy by letting out unnecessary charges even when the power for driving the light source LS is increased. This can also improve the aperture ratio as a matter of course.

While the above-mentioned embodiment illustrates a mode in which a plurality of photogate electrodes PG are arranged one-dimensionally while being spatially separated from each other, i.e., pixels are arranged one-dimensionally, they may be arranged two-dimensionally as a matter of course.

REFERENCE SIGNS LIST 9a, 9b . . . third semiconductor region (signal charge collection region); 11a, 11b . . . fourth semiconductor region (unnecessary charge collection region); G1, G2, G3, G4 . . . pixel (range sensor); L1 . . . first longer side; L2 . . . second longer side; RS . . . range image sensor; S1 . . . first shorter side; S2 . . . second shorter side; $S_1$, $S_2$ . . . charge transfer signal; TX1 . . . first transfer electrode; TX2 . . . second transfer electrode; TX3 . . . third transfer electrode (unnecessary charge collection gate electrode)

The invention claimed is:
1. A range sensor comprising:
a photoresponsive region, having a two-dimensional form including first and second longer sides opposing each other and first and second shorter sides opposing each other, for generating a charge in response to incident light;
at least two pairs of signal charge collection regions, arranged such as to oppose each other while interposing the first and second longer sides of the photoresponsive region, for collecting signal charges from the photoresponsive region;
a plurality of transfer electrodes, including at least two pairs of transfer electrodes facing each other, fed with charge transfer signals having different phases and respectively disposed between the signal charge collection regions and the photoresponsive region;
a plurality of unnecessary charge collection regions, each of the plurality of unnecessary charge collection regions is arranged between two of the signal charge collection regions of the at least two pairs of signal charge collection regions along the longer side of the photoresponsive region, for collecting unnecessary charges from the photoresponsive region; and
a plurality of unnecessary charge collection gate electrodes, respectively disposed between the plurality of unnecessary charge collection regions and the photoresponsive region, for selectively blocking and releasing flows of the unnecessary charges from the photoresponsive region to the plurality of unnecessary charge collection regions.

2. A range sensor according to claim 1, wherein the plurality of transfer electrodes have a length in the direction of the first and second longer sides greater than a length of the plurality of unnecessary charge collection gate electrodes in the direction of the first and second longer sides.

3. A range sensor according to claim 1 or 2, wherein the plurality of transfer electrodes have a plurality of first transfer electrodes fed with charge transfer signals having a same phase and a plurality of second transfer electrodes fed with charge transfer signals having a phase different from that of the charge transfer signals for the first transfer electrodes;

wherein the plurality of first transfer electrodes are arranged between the plurality of signal charge collection regions and the photoresponsive region on the side of the first longer side of the photoresponsive region along the first longer side; and wherein the plurality of second transfer electrodes are arranged between the plurality of signal charge collection regions and the photoresponsive region on the side of the second longer side of the photoresponsive region along the second longer side opposing the first longer side.

4. A range sensor according to claim 1 or 2, wherein the plurality of transfer electrodes have a plurality of first transfer electrodes fed with charge transfer signals having a same phase and a plurality of second transfer electrodes fed with charge transfer signals having a phase different from that of the charge transfer signals for the first transfer electrodes;

wherein the plurality of first transfer electrodes are arranged between the plurality of signal charge collection regions and the photoresponsive region while interposing the first and second longer sides of the photoresponsive region; and wherein the plurality of second transfer electrodes are arranged between the plurality of signal charge collection regions and the photoresponsive region while interposing the first and second longer sides of the photoresponsive region.

5. A range image sensor having an imaging region constituted by a plurality of one- or two-dimensionally arranged units on a semiconductor substrate and yielding a range image according to a charge amount issued from the units;

wherein one of the units is the range sensor according to claim 1.

* * * * *